(12) United States Patent
Hamilton et al.

(10) Patent No.: US 6,822,909 B1
(45) Date of Patent: Nov. 23, 2004

(54) METHOD OF CONTROLLING PROGRAM THRESHOLD VOLTAGE DISTRIBUTION OF A DUAL CELL MEMORY DEVICE

(75) Inventors: Darlene G. Hamilton, San Jose, CA (US); Edward Hsia, Saratoga, CA (US); Mark W. Randolph, San Jose, CA (US); Edward F. Runnion, Santa Clara, CA (US); Kulachet Tanpairoj, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/422,090

(22) Filed: Apr. 24, 2003

(51) Int. Cl.[7] ............................................... G11C 11/34
(52) U.S. Cl. .............................. 365/185.28; 365/185.24
(58) Field of Search ........................ 365/185.24, 185.28

(56) References Cited

U.S. PATENT DOCUMENTS

| | | | |
|---|---|---|---|
| 5,539,690 A | * 7/1996 | Talreja et al. | ........... 365/185.22 |
| 6,215,702 B1 | 4/2001 | Derhacobian et al. | . 365/185.29 |
| 6,246,611 B1 | 6/2001 | Pawletko et al. | ...... 365/185.29 |
| 6,295,228 B1 | 9/2001 | Pawletko et al. | ...... 365/185.22 |
| 6,307,784 B1 | 10/2001 | Hamilton et al. | ...... 365/185.22 |
| 6,309,926 B1 | 10/2001 | Bell et al. | ................... 438/257 |
| 6,331,951 B1 | 12/2001 | Bautista, Jr. et al. | ... 365/185.22 |
| 6,344,994 B1 | 2/2002 | Hamilton et al. | ...... 365/185.05 |
| 6,356,482 B1 | 3/2002 | Derhacobian et al. | . 365/185.29 |
| 6,370,061 B1 | 4/2002 | Yachareni et al. | ..... 365/185.22 |
| 6,400,624 B1 | 6/2002 | Parker et al. | ............... 365/201 |
| 6,442,074 B1 | 8/2002 | Hamilton et al. | ...... 365/185.29 |
| 6,456,533 B1 | 9/2002 | Hamilton et al. | ...... 365/185.22 |

OTHER PUBLICATIONS

*Intel StrataFlash Memory Technology*, Intel Corporation, AP–677, Application Note, Dec. 1998, Order No. 297859–002.

* cited by examiner

*Primary Examiner*—M. Tran
(74) *Attorney, Agent, or Firm*—Renner, Otto, Boisselle & Sklar, LLP (57) ABSTRACT

A method of programming a dual cell memory device having a first charge storing cell and a second charge storing cell. The method can include applying an initial program pulse to the memory device; comparing the threshold voltage of the memory device with a verify threshold voltage; and if the threshold voltage of the memory device is less than the verify threshold voltage, applying a second program pulse to the memory device during which at least one condition of the second program pulse is modified from the initial program pulse.

36 Claims, 4 Drawing Sheets

METHOD OF CONTROLLING PROGRAM THRESHOLD VOLTAGE DISTRIBUTION OF A DUAL CELL MEMORY DEVICE

TECHNICAL FIELD

The present invention relates generally to the field of non-volatile memory devices and, more particularly, to a method of controlling program threshold voltage distributions of a dual cell electrically erasable and programmable charge trapping dielectric flash memory device.

BACKGROUND

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual cell memory device, such as a charge trapping dielectric flash memory device, can store data in a "double-bit" arrangement. That is, one bit (i.e., a binary data value have two states, such as a logical one and a logical zero) can be stored using a charge storing cell on a first "side" of the memory device and a second bit can be stored using a complimentary charge storing cell on a second "side" of the memory device.

Programming of such a memory device can be accomplished, for example, by hot electron injection. Hot electron injection involves "pulsing" the device by applying appropriate voltage potentials to each of a gate and a drain of the memory device for a specified duration. During the programming pulse, the source is conventionally grounded. Following the programming pulse, a verify operation is carried out to ensure that the memory device stores a desired amount of charge corresponding the intended data value (or data state).

If the verify operation indicates that the memory device failed to become sufficiently programmed, the memory device is pulsed again with the same programming voltages as used during the earlier pulse. For example, the program voltages at 25 degrees C. can be about 9.8 volts (V) for the gate voltage ($V_g$) and about 5.5 V for the drain voltage ($V_d$). At 90 degrees C., $V_g$ can be about 10.5 V and $V_d$ can be about 5.5 V. The foregoing programming procedure is followed both for core memory cells (e.g., those cells used to store data by a customer of the memory unit) and for dynamic reference cells (e.g., those cells used to hold a reference amount of charge to establish a reference threshold voltage used during a read operation of the core memory cells).

The conventional program/verify operation can result in large program threshold voltage distributions. That is, a first program pulse may cause the memory cell to store a certain amount of charge, but that charge amount may not be sufficient enough to raise the threshold voltage (Vt) of the memory device over a verify threshold voltage. The next program pulse may place additional charge in the memory cell, for a total amount of stored charge that is needlessly greater than the amount of charge sufficient to raise the Vt of the memory device to pass the verify operation.

Large program distributions can be problematic when attempting to program and/or read memory devices that are configured to store discernable levels of charge. Accordingly, there exists a need in the art for improved control over program threshold voltage distributions of a dual cell memory device.

SUMMARY OF THE INVENTION

According to one aspect of the invention, the invention is directed to a method of programming a charge trapping dielectric memory device having a first charge storing cell and a second charge storing cell. The method can include a) applying an initial program pulse including initial gate, drain and source program voltages to the memory device to inject an amount of charge into a selected one of the first or second charge storing cells, the amount of charge corresponding to a charged program level; b) comparing a threshold voltage of the memory device with a verify threshold voltage; and c) if the threshold voltage of the memory device is less than the verify threshold voltage, applying a second program pulse to the memory device during which at least one of the initial gate, drain and source program voltages is modified from the corresponding initial program voltage.

BRIEF DESCRIPTION OF DRAWINGS

These and further features of the present invention will be apparent with reference to the following description and drawings, wherein.

DISCLOSURE OF INVENTION

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

Figure 1:
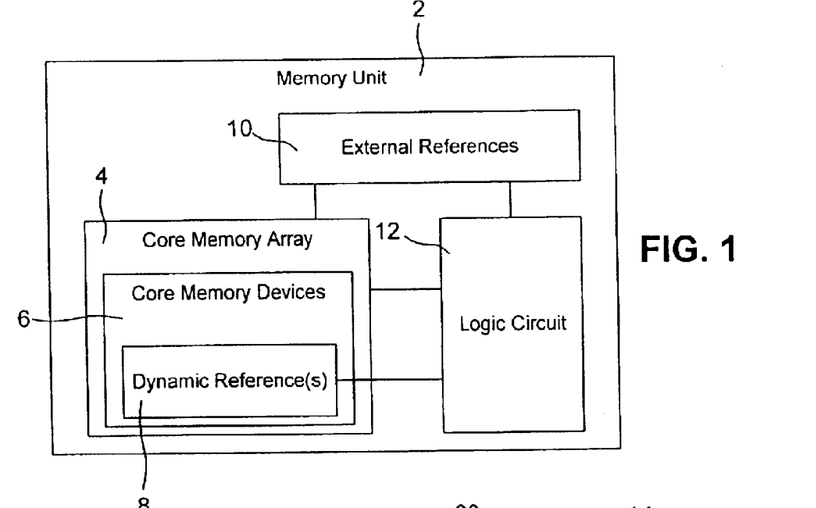
FIG. 1 is a schematic block diagram of an exemplary memory unit having a plurality of core memory devices to which a method of programming in accordance with the present invention can be applied.

With reference to FIG. 1, shown is a schematic block diagram of an exemplary memory unit 2. The memory unit 2 can include a core memory array 4 containing a plurality of memory devices, such as dual cell, non-volatile, flash electrically erasable and programmable memory devices. For example, the memory devices can be charge trapping dielectric flash memory devices as will be discussed in greater detail below.

The memory devices of the core memory array 4 can include a plurality of core memory devices 6 and associated dynamic reference memory devices 8. In one embodiment, the array 4 can be arranged such that the dynamic reference memory devices 8 are formed within a matrix of the core memory devices 6.

Other memory devices, such as external references 10, can also form a part of the memory unit 2. The external reference 10 are separate from the core memory array 4 and can include, for example, erase verify reference cells, program verify reference cells and soft programming reference cells.

As one skilled in the art will appreciate, the core memory devices 6 can be used by a customer of the memory unit 2 to store information, such as data or executable code. The dynamic references 8 can be used to assist in reading the core memory devices 6. More specifically, the dynamic references 8 are used as indicators of the data level behavior of the core memory devices 6. Various operations of the memory unit 2, including, for example, programming, verifying, reading and erasing, can be controlled by a logic circuit 12.

Figure 2:
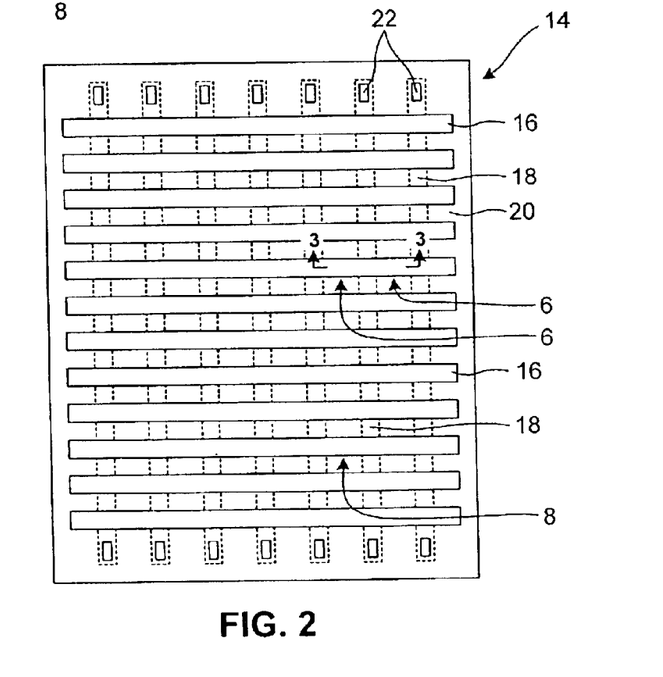
FIG. 2 is a schematic block diagram of a portion of a core memory array from the memory unit that can include the core memory devices.

With additional reference to FIG. 2, shown is a top view, schematic block diagram of a portion, or sector 14, of the core memory array 4 from the memory unit 2. The sector 14 can include core memory devices 6 and one or more dynamic reference devices 8. The sector 14 can include word lines 16 and bit lines 18 arranged with a dielectric stack 20 to operatively form the core memory devices 6 and the dynamic reference device(s) 8. Application of appropriate voltages to the word lines 16 and the bit lines 18 allows for the addressing of the memory devices 6, 8 of the sector 14 such that each memory device can be programmed, read, verified and/or erased. Bit line contacts 22 can be used to establish electrical connection to the bit lines 18 through the dielectric stack 20.

Figure 3:
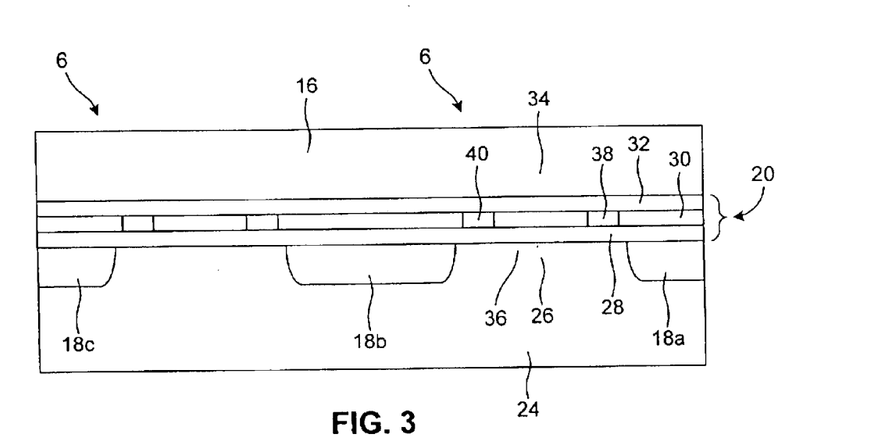
FIG. 3 is a schematic cross-section illustration of exemplary core memory devices from the core memory array taken along the line 3—3 of FIG. 2.

With additional reference to FIG. 3, a portion of the sector 14 is illustrated in cross-section to illustrate an exemplary arrangement of the memory devices of the core memory array 4. The cross-section of FIG. 3 shows two core memory devices 6. Each of the core memory devices 6, as well as the dynamic reference memory devices 8, can be implemented as a virtual ground, dual cell, non-volatile, flash electrically erasable and programmable memory devices. It should be understood that the illustrated memory devices 6 are shown for exemplary purposes and can be implemented with alternative structures (e.g., in stacked gate arrangement, in recessed gate arrangement, etc.). In addition, the relative positioning of the core memory devices 6 with respect to the dynamic reference 8 can be modified.

The exemplary memory devices 6 are implemented as a charge trapping dielectric type flash memory devices, each of which includes a pair of complimentary charge trapping regions 38, 40 that can be independently programmed and read.

For simplicity of the discussion herein, only the arrangement of one core memory device 6 will be described. However, the remaining core memory devices 6 and the dynamic reference memory devices 8 can have a corresponding structure and operation.

In the illustrated embodiment, the core memory device 6 includes a P-type semiconductor substrate 24. Within the substrate 24, the bit lines 18 are formed in a buried bit line format. The bit lines 18 (also referred to herein as conductive regions) can be formed by implanting N-type dopant into the substrate 24, or from a metal or metal containing compound (e.g., silicide bit lines 18). For each device 6, adjacent pair of bit lines 18 form conductive regions that function as a source and a drain during various programming and reading operations. For each device, a body 26 is disposed between the adjacent pairs of bit lines 18. Although not illustrated, a nitride layer can be formed over the bit lines 18 and P+ pocket implants can be added adjacent the bit lines 18.

Above the substrate 24 is the dielectric stack 20. The dielectric stack 20 includes a bottom dielectric layer 28 (also referred to as a tunneling dielectric layer) that is made from, for example, silicon oxide ($SiO_2$), other standard-K material (e.g., have a relative permittivity below ten) or a high-K material (e.g., have a relative permittivity, in one embodiment, above ten and, in one embodiment, above twenty).

Over the bottom dielectric layer 28 is a charge trapping layer (also referred to as a charge storing layer 30). The charge storing layer 30 can be made from, for example, a non-conductive material including silicon nitride ($Si_3N_4$) or other suitable material.

Over the charge storing layer 30 is another dielectric layer (also referred to as a top dielectric layer 32) made from a material such as, for example, silicon oxide, other standard-K material or a high-K material.

The word lines 16 are formed over the top dielectric layer 32. For each core memory device 6, one of the word lines 16 functions as a gate electrode 34. The word lines 16 can be formed from, for example, polycrystalline silicon. In alternative arrangements, the gate electrodes 34 can be formed from interconnected conductive islands or pads. A work function of the word line 16 and the dielectric stack 20 controls a channel 36 within the body 26, extending from one bit line 18 to an adjacent bit line 18.

As one skilled in the art will appreciate, modifications to the core memory devices 6 can be made. Such modifications can include changes to the physical arrangement of the core memory device 6, materials used, doping parameters and the like. However, the programming, verifying, reading and/or erasing techniques described herein can be used in conjunction with such a modified device.

The core memory devices 6 can be configured as a virtual ground devices. That is, during various operations of the memory devices 6 either of the bit lines 18 associated with the memory device 6 can function as a source of electrons or holes by respectively controlling the voltage potentials applied to the corresponding bit lines 18. In addition, the bit line 18 that functions as the source of electrons and/or holes can be grounded or can be connected to a bias potential.

As will become more apparent from the discussion below, within the charge storing layer 30, the core memory device 6 includes a first charge storing region (also referred to herein as a normal cell, a right-hand bit or a first charge storing cell 38) adjacent one of the conductive regions (e.g., the bit line identified as bit line 18*a*) and a second charge storing region (also referred to herein as a complimentary cell, a left-hand bit or a second charge storing cell 40) adjacent the other of the conductive regions (e.g., the bit line identified as bit line 18*b*).

In one embodiment, referred to herein as a "single-bit" embodiment, each charge storing cell 38, 40 can have two data states. However, each charge storing cell 38, 40 is programmed to stored the same data state to enhance data retention. To determine the data state stored by each charge storing cell 38, 40, only one of the charge storing cells 38, 40 needs to be read.

In another embodiment, referred to herein as a "dual-bit" embodiment, each charge storing cell 38, 40 can independently have two data states. That is, each charge storing cell 38, 40 can be programmed to either of the data states to take advantage of the asymmetrical date storage capability of the core memory device 6. To determine the data state stored by each charge storing cell 38, 40, each of the charge storing cells 38, 40 can be read in separate read operations.

In the single-bit embodiment and the dual-bit embodiment, the data states can represent binary values such as a logical zero and a logical one. The logical one, for example, can be implemented by leaving the desired charge storing cell 38, 40 in an unprogrammed state, also referred to as a blank program level. The logical zero, for example, can be implemented by storing an amount of charge in the desired charge storing cell 38, 40. This condition is also referred to as a charged state, a programmed state, a programmed level or a charged program level.

In another embodiment, referred to herein as a "single-bit multi-level cell (MLC)" embodiment or "single-bit MLC" embodiment, each charge storing cell 38, 40 can have multiple data states, such as four data states. However, each charge storing cell 38, 40 is programmed to stored the same data state to enhance data retention. To determine the data state stored by each charge storing cell 38, 40, only one of the charge storing cells 38, 40 needs to be read. Therefore, in the single-bit MLC embodiment, each core memory device 6 (or "transistor") has four data states (i.e., the four data states associated with the read charge storing cell 38, 40). In another embodiment there can be more than three charged program levels.

In another embodiment, referred to herein as a "quad-bit" embodiment, each charge storing cell 38, 40 can independently have multiple data states, such as four data states. That is, each charge storing cell 38, 40 can be programmed to any of the multiple data states to take advantage of the asymmetrical date storage capability of the core memory device 6. To determine the data state stored by each charge storing cell 38, 40, each of the charge storing cells 38, 40 can be read in separate read operations. Therefore, in the quad-bit embodiment, each core memory device 6 (or "transistor") has sixteen data states (i.e., between the associated pair of charge storing cells 38, 40, there are sixteen permutations of the blank program level and the three charged program levels). In another embodiment there can be more than three charged program levels.

In the single-bit MLC embodiment and the quad-bit embodiment, the data states of the individual charge storing cells 38, 30 can represent a two bit binary word, such as a logical zero-zero, logical zero-one, logical one-zero and logical one-one. The logical one-one data state, for example, can be implemented by leaving the desired charge storing cell 38, 40 in an unprogrammed state, also referred to as a blank program level which will be referred to herein as "level A". The other logical data states, for example, can be implemented by storing distinguishable amounts of charge in the desired charge storing cell 38, 40, which are also referred to as a charged states, programmed states, programmed levels or charged program levels. A lowest charged program level corresponding to the one-zero data state will be referred to herein as "level B". A medium charged program level corresponding to the zero-one data state will be referred to herein as "level C". A highest charged program level corresponding to the zero-zero data state will be referred to herein as "level D". In another implementation of the single-bit MLC embodiment and the quad-bit embodiment, there can be more than three charged program levels.

In the illustrated embodiment, the core memory device 6 is a structurally symmetrical device allowing for programming, verifying, reading and erasing of the first charge storing cell 38 and the second charge storing cell 40 by respectively switching the roles of the bit lines 18a and 18b (source and drain) during those operations. Therefore, the bit lines 18a, 18b will be referred to interchangeably by the terms source and drain, depending on the charge storing cell 38, 40 of interest.

For purposes of the present disclosure, the programming technique to store charge with either of the charge storing cells 38, 40 involves hot electron injection, also referred to as channel hot electron injection (CHE). However, it should be appreciated that modifications to the programming techniques can be made to accommodate variations in the specific memory device used.

Using hot electron injection, the first charge storing cell 38 can be programmed to the desired charged program level (in the single-bit and dual-bit embodiments, the single charged program level or in the single bit MLC and quad-bit embodiments, any of the multiple charged program levels) by applying a selected voltage to the bit line 18a (functioning as the drain) adjacent the first charge storing cell 38. In addition, a selected voltage is applied to the word line 16 (functioning as the gate electrode 34). The other bit line 18b functions as the source (i.e., source of electrons) for the CHE programming of the first charge storing cell 38. In one embodiment, a bias voltage potential is applied to the source (rather than grounding or floating the source as found in conventional charge trapping dielectric flash memory devices). As a result of the application of a bias potential to the source during programming, greater control over electron injection can be accomplished, which can lead to enhanced data retention capability of the memory device 6 and/or greater charge injection accuracy for achieving the desired charged program level.

The voltages applied to the gate electrode 34, the source and the drain generate a vertical electric field through the dielectric layers 28, 32 and the charge storing layer 30 and a lateral electric field along the length of the channel 36 from the source to the drain. At a given threshold voltage, the channel 36 will invert such that electrons are drawn off the source and begin accelerating toward the drain. As the electrons move along the length of the channel 36, the electrons gain energy and upon attaining enough energy, the electrons are able to jump over the potential barrier of the bottom dielectric layer 28 and into the charge storing layer 30 where the electrons become trapped. The probability of electrons jumping the potential barrier is a maximum in the area of the charge storing cell 38 adjacent the drain (i.e., bit line 18a), where the electrons have gained the most energy. These accelerated electrons are termed hot electrons and once injected into the charge storing layer 30, stay in the charge storing cell 38 of the charge storing layer 30. The trapped electrons tend not to spread through the charge storing layer 30 due to this layer's low conductivity and low lateral electric field therein. Thus, the trapped charge remains localized in the charge trapping region of the charge storing cell 38 close to the adjacent bit line 18a.

The foregoing technique to program the first charge storing cell 38 can be used to program the second charge storing cell 40, but the functions of the bit lines 18a and 18b (i.e., source and drain) are reversed.

Figure 4:
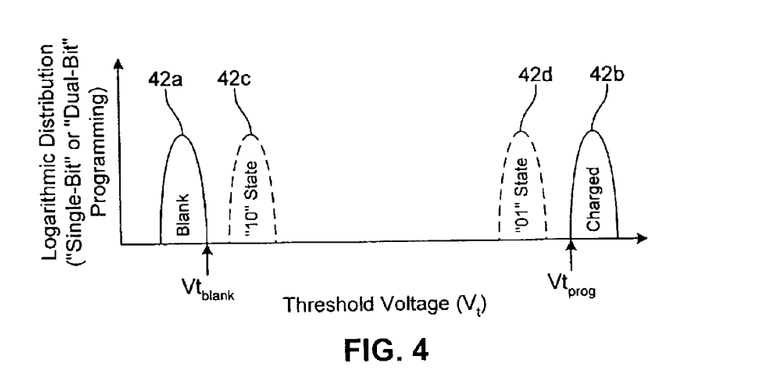
FIG. 4 is a population plot that includes relative program level threshold voltage distributions for "single-bit" and "dual-bit" programming of a charge storing cell from the core memory device.

With additional reference to FIG. 4, shown is a population plot that includes relative program level threshold voltage (Vt) distributions 42 for single-bit and dual-bit programming of a charge storing cell 38, 40 from the core memory device 6. The threshold voltage distributions 42 are indicative of the data state behavior of the core memory device 6 when the charge storing cells 38, 40 are placed in various respective data states.

A first distribution 42a represents a logarithmic threshold voltage distribution for the memory device 6 when both charge storing cells 38, 40 store respective charge amounts corresponding to the blank program level. That is, when one of the charge storage cells 38, 40 is read and both charge storing cells 38, 40 are in the blank state, the threshold voltage of the memory device 6 should fall within the first distribution 42a. Using the corresponding binary data values for this data storage condition, the first distribution 42a can be referred to as a "11" state, where the first "1" of the "11" corresponds to charge storing cell 38, 40 being read (or "read bit") and the second "1" of the "11" corresponds to the other of the charge storing cells 38, 40 (or "unread bit"). A maximum value of the first distribution 42a represents an erase or blank threshold voltage ($Vt_{blank}$) of the core memory device 6.

A second distribution 42b represents a logarithmic threshold voltage distribution for the core memory device 6 when both charge storing cells 38, 40 store respective charge amounts corresponding to the charged program level. That is, when one of the charge storage cells 38, 40 is read and both charge storing cells 38, 40 are in the charged state, the threshold voltage of the memory device 6 should fall within the second distribution 42b. Using the corresponding binary data value for this data storage condition, the second distribution 42b can be referred to as a "00" state, where the first "0" of the "00" corresponds to the read bit and the second "0" of the "00" corresponds to the unread bit.

A third distribution 42c represents a logarithmic threshold voltage distribution for the core memory device 6 when the read one of the charge storing cells 38, 40 stores a charge amount corresponding to the blank program level and the unread one of the charge storing cells 38, 40 stores a charge amount corresponding to the charged program level. Using the corresponding binary data value for this data storage condition and the first and second digit naming convention identified above, the third distribution 42c can be referred to as a "10" state. The "10" state can also be referred to as a complimentary bit disturb (CBD) state since the charge stored by the unread bit has the effect of slightly increasing the threshold voltage of the memory device 6 above the blank state distribution 42a.

A fourth distribution 42d represents a logarithmic threshold voltage distribution for the core memory device if the read one of the charge storing cells 38, 40 stores a charge amount corresponding to the charged program level and the unread one of the charge storing cells 38, 40 stores a charge amount corresponding to the blank program level. Using the corresponding binary data value for this data storage condition and the first and second digit naming convention identified above, the third distribution 42b can be referred to as a "01" state. In this situation, the differing charge amounts stored by the charge storing cells 38, 40 has the effect of slightly decreasing the threshold voltage of the memory device 6 below the programmed state distribution 42b.

Figure 5:
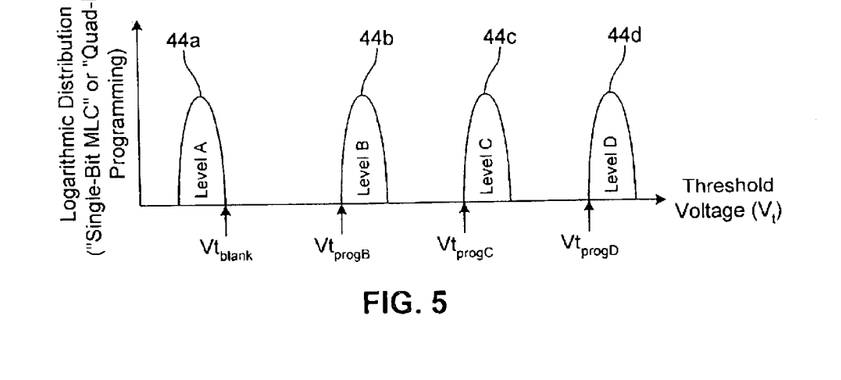
FIG. 5 is a population plot that includes relative program level threshold voltage distributions for "single-bit multilevel cell (MLC)" and "quad-bit" programming of a charge storing cell from the core memory device.

With additional reference to FIG. 5, shown is a population plot that includes relative threshold voltage (Vt) distributions 44 for single-bit MLC and quad-bit programming of a charge storing cells 38, 40 from the core memory device 6. The blank state, or level A, is represented by distribution 44a, level B is represented by distribution 44b, level C is represented by distribution 44c and level D is represented by distribution 44d. Relative threshold voltage distributions for the data states of the other of the charge storing cells 38, 40 of the core memory device 6 would have similar appearance to those illustrated in FIG. 5. For simplicity of the drawing figures attached hereto, CBD threshold voltage distributions similar to the CBD threshold distributions 42c and 42d (FIG. 4) illustrated for the single bit and dual bit embodiments are not illustrated in FIG. 5. However, when the charge storing cells 38, 40 are programmed to dissimilar data states, the threshold voltage distributions 44 can have a tendency to shift upward or downward along the threshold voltage axis as a result of CBD.

A combination of program conditions (discussed below in greater detail) can be selected such that when the target charge storing cell 38, 40 is programmed to level D, the amount of charged stored by the cell 38, 40 is higher than the amount of charge stored by the cell 38, 40 when the cell 38, 40 is programmed to level C. In one embodiment, a minimum threshold voltage ($Vt_{progD}$) of the level D distribution 44d is about one volt higher than a maximum threshold voltage of the level C distribution 44c. Similarly, the amount of charged stored by the cell 38, 40 programmed to level C is higher than the amount of charge stored by the cell 38, 40 when the cell 38, 40 is programmed to level B. In one embodiment, a minimum threshold voltage ($Vt_{progC}$) of the level C distribution 44c is about one volt higher than a maximum threshold voltage of the level B distribution 44b. Similarly, the amount of charged stored by the cell 38, 40 programmed to level B is higher than the amount of charge stored by the cell 38, 40 when the cell 38, 40 is programmed to level A. In one embodiment, a minimum threshold voltage ($Vt_{progB}$) of the level B distribution 44b is about 1.5 volts higher than a maximum threshold voltage of the level A distribution 44a, or the erase threshold voltage ($Vt_{blank}$).

It is noted that the threshold voltage distribution 42a for the blank state of the single-bit and dual-bit embodiments can correspond to the threshold voltage distribution 44a for the blank state of the single-bit MLC and quad-bit embodiments (e.g., the minimum, maximum and peak distribution points can be the same or approximately the same). Similarly, the threshold voltage distribution 42b for the charged program state of the single-bit and dual-bit embodiments can correspond to the threshold voltage distribution 44d for the highest charge program state of the single-bit MLC and quad-bit embodiments (e.g., the minimum, maximum and peak distribution points can be the same or approximately the same).

Reading of the cells 38, 40 of the core memory device 6 can be carried out using, for example, a reverse read operation. For example, to read the first charge storing cell 38, a voltage can be applied to the conductive region opposite the first charge storing region 38 (i.e., bit line 18b, which is also referred to as the drain during read operations) and a voltage can be applied to the gate electrode 34. The conductive region adjacent the first charge storing region 38 (i.e., bit line 18a, which is also referred to as the source during read operations) can be grounded. To read the second charge storing cell 40, the roles of the bit lines 18a and 18b can be reversed.

During the read operation, an amount of current drawn across the channel 36 can be used as an indication of core memory device 6 threshold voltage and can be compared against a reference current(s) (the reference current acting as an indication of a reference threshold voltage) to determine the data state of the "read" one of the charge storing cells 38, 40.

The read operation drain voltage functions to create a depletion region in the channel 36 under the unread charge storing cell 38, 40. This depletion region can partially mask, or "cover up," any charge stored by the unread charge storing cell 38, 40 to minimize the effect of CBD on read margin. For the dual-bit and quad bit embodiments, the drain voltage can be about 1.3 V to about 1.6 V and the gate voltage can be about five volts. For the single-bit and single-bit MLC embodiments, the drain voltage can be less than one volt (e.g., about 0.4 volts to about 0.7 volts) and the gate voltage can be about three volts.

With continued reference to FIGS. 4 and 5, it is noted that it is desirable to maintain relatively narrow threshold voltage distributions 42 and 44. More specifically, when the differential from the distribution's 42, 44 minimum threshold voltage to the distribution's 42, 44 maximum threshold voltage is kept relatively small (e.g., a few tenths of a volt), then read margin between the threshold voltage distributions 42, 44 can be enhanced. For instance, the "10" state (or CBD state) threshold distribution 42c width tracks with the width of the "00" state distribution 42b. The wider these distributions become, the harder it may be to generate a read operation reference current (or threshold voltage) to differentiate between the various program levels. Similar issues can arise with greater frequency in the single-bit MLC and the quad-bit embodiments due to the greater number of possible data state combinations that can be stored by the memory device 6.

The width of the threshold voltage distributions 42, 44 is dependent, in part, to the program conditions for the core memory devices 6. For example, charge injection for core memory devices 6 adjacent, the bit line contacts 22 tends to progress relatively quickly due to the relatively low resistance of the bit lines 18 from the contacts 22 to the core memory devices 6. However, core memory device 6 located between sets of contacts 22 can experience slower charge injection due to losses created by bit line 18 resistance from the contacts 22 to the memory devices 6. Therefore, given the same program voltages for all core memory devices 6, the various core memory devices 6 may experience different charge injection behavior. Using conventional programming techniques, the voltage drop along the bit lines 18 can have a tendency to widen the distributions 42, 44 of the core memory devices 6. For example, a greater number of program pulses may be required to program the devices located between contacts 22, resulting in the injection of extra charge.

The methods of programming the core memory devices 6 described herein can assist in controlling the width of the threshold voltage distributions 42, 44. In addition, the desire to tightly control distribution 42, 44 width is balanced with programming operation speed when programming a plurality of the core memory devices 6. Accordingly, the methods described herein are adapted to program the core memory devices 6 adjacent the bit line 18 contacts 22 slowly enough so as to avoid overshooting the desired injected charge amount for a desired charged program level. In addition, programming is adapted to carrying out programming of the core memory devices 6 centrally located between sets of bit line 18 contacts 22 in a relatively expedient manner. The methods can include selecting initial program pulse voltages that have a highly likelihood of injecting a desired amount of charge into at least the core memory devices 6 adjacent the bit line 18 contacts 22. Subsequent program voltage pulses with tailored subsequent-pulse program voltages can be used to inject additional charge into any core memory device 6 that do not become programmed as desired with the previous program pulses.

Figure 6:
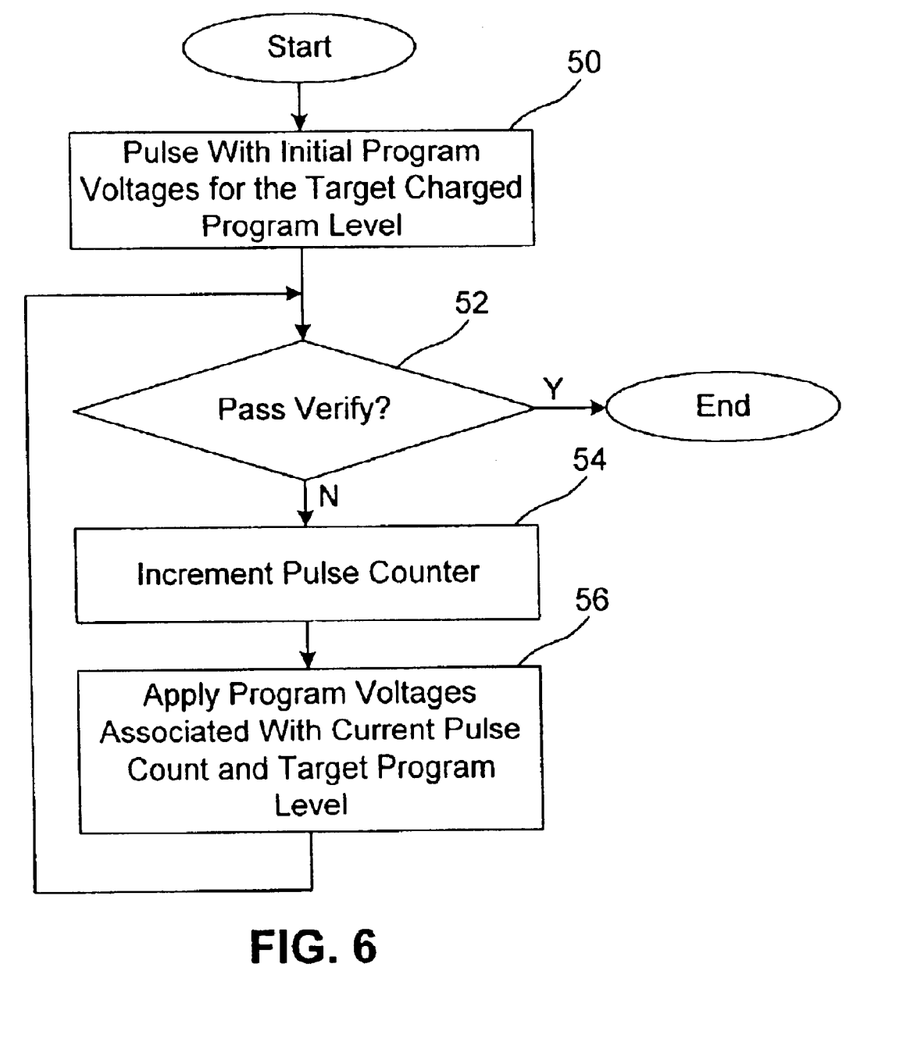
FIG. 6 is a flow diagram of a first method of programming the dual cell memory device to control program level threshold voltage distribution.

Turning now to FIG. 6, a flow diagram of a first method of programming one of the charge storing cells 38, 40 of the memory device 6 is illustrated. If desired, the method can be carried out multiple times to program the other of the charge storing cells 38, 40 or to program charge storing cells 38, 40 of other core memory devices 6. The first method changes the program conditions (e.g. gate voltage ($V_g$), source bias ($V_s$) and drain voltage ($V_d$)) based on the how many program pulses have been applied to the memory device 6 during the programming of the target charge storing cell 38, 40. The programming method includes application of program voltage pulses (i.e., applying specified voltage potentials to each of the word line 16 (gate electrode 34) and the bit lines 18 that function as the source and the drain).

Following the application of each program pulse, a verify operation can be conducted to verify that the target charge storing cell 38, 40 was programmed to the desired charged program level B–D (single-bit MLC embodiment and quad-bit embodiment) or single charge program level (single-bit embodiment and dual-bit embodiment). The verify operation can include comparing a drain to source current ($I_{ds}$) of the core memory device 6 that is generated when appropriate voltages are applied to the gate electrode 34, the source and/or the drain against a current generated by an external verify reference device corresponding to the desired charged program level.

Accordingly, the external references 10 (FIG. 1) can include various fixed (e.g., statically programmed) program-verify references for providing reference currents corresponding to the charged program levels B–D (single-bit MLC embodiment and quad-bit embodiment) or single charge program level (single-bit embodiment and dual-bit embodiment). For example, in the single-bit MLC and the quad-bit embodiments the program-verify references in the can generate a level B program-verify reference current ($I_{vrefB}$) for verifying charge storage corresponding to level B, a level C program-verify reference current ($I_{vrefC}$) for verifying charge storage corresponding to level C, and a level D program-verify reference current ($I_{vrefD}$) for verifying charge storage corresponding to level D. In the single-bit and dual-bit embodiments, the program-verify reference can generate a charged program level verify reference for verifying charge storage corresponding the charged program level. In one embodiment, the charged program level verify reference current for the single-bit and dual-bit embodiments can be the same as the level D program-verify reference current ($I_{vrefD}$).

If the $I_{core}$ is greater than the $I_{vref}$ corresponding to the desired program level, then the logic circuit 12 can conclude that the target charge storing cell 38, 40 is appropriately charged and programming of a subsequent charge storing cell 38, 40 to be programmed can be commenced. If, however, $I_{ds}$ is less than the $I_{vref}$ corresponding to the desired program level, then the logic circuit 12 can conclude that the target charge storing cell 38, 40 is not charged to the desired program level and the target charge storing cell 38, 40 can be repulsed according to the methods described herein or similar techniques for progressive control over the program pulse voltages and/or rates of charge injection.

The voltage potentials associated with each program pulse will also depend on the desired program level to which the charge storing cell 38, 40 is being charged. The first pulse applied to each of the gate electrode 34, the source and the drain will have an initial voltage potential (respectively, $V_{go}$, $V_{so}$, and $V_{do}$). Any subsequent pulse(s) can be adjusted to attempt to inject an additional amount of charge into the desired charge storing cell 38, 40 so that the charge storing cell 38, 40 has an amount of charge falling within the desired distribution 42, 44.

In one embodiment, the voltage potential applied to the gate electrode 34 ($V_g$) during a particular program pulse can be determined by equation 1 (Eq. 1) where "$V_{go}$" is the initial pulse voltage for the desired charged program level, "Pulse No." is the pulse number (e.g., first, second, third, etc.) and "$\Delta V_g$" is a voltage adjustment value, which could be positive or negative in value.

$$V_g = V_{go} + (\text{Pulse No.} - 1) \times \Delta V_g \qquad \text{Eq. 1}$$

Similarly, the voltage potential applied to the source ($V_s$) during a particular program pulse can be determined by equation 2 (Eq. 2) and the voltage potential applied to the drain ($V_d$) during a particular program pulse can be determined by equation 3 (Eq. 3), where equations 2 and 3 use similar nomenclature to that of equation 1. The source voltage adjustment value ("$\Delta V_s$") could be positive or negative in value and the drain adjustment value ("$\Delta V_d$") could be positive or negative in value.

$$V_{so} = V_{so} + (\text{Pulse No.} - 1) \times \Delta V_s \qquad \text{Eq. 2}$$

$$V_d = V_{do} + (\text{Pulse No.} - 1) \times \Delta V_d \qquad \text{Eq. 3}$$

The program pulse duration (i.e., the length of time each program pulse is applied to the memory device 6 and also referred to as pulse width) can also be modified. For example, the pulse width can be governed by equation 4 (Eq. 4), where PW stands for pulse width (i.e., pulse application duration), $PW_0$ is the initial pulse width and $\Delta PW$ is a pulse width adjustment value.

$$PW = PW_0 + (\text{Pulse No.} - 1 \times \Delta PW) \qquad \text{Eq. 4}$$

It should be understood that the variable for of equations 1 through 4 can be selected based on the desired charged program level.

Table 1 shows the resulting voltage potentials and pulse width to be applied to the gate electrode 34, the source and the drain for each program pulse as derived from equations 1 though 4.

$V_{so}$, and $V_{do}$ for each charged program level, can be selected by experimentation to result in values that optimize memory device 6 programming (e.g., programming speed) and program level threshold voltage distributions 42, 44 parameters (e.g., minimum value, maximum value and peak value).

In one embodiment, the initial program voltage values $V_{go}$, $V_{so}$ and $V_{do}$ are selected to quickly inject charge in the charge storing cells 38, 40. Without intending to be bound by theory, it is believed that the initial program voltages can sufficiently inject charge into at least the memory devices 6 adjacent the bit line 18 contacts 22 with regularity. In addition, the initial program values can be selected to inject charge into lateral outside portions of the charge storage cells 38, 40. That is, during programming the first pulse can be selected to inject charge into the charge storing cells 38, 40 adjacent the drain/body junction.

The adjustment values $\Delta V_g$, $\Delta V_s$, and $\Delta V_d$ can be selected so that subsequent pulses gradually modifies charge injection such that the charge storing cells 38, 40 that fail the previous verify operation can be injected with additional charge under controlled circumstances. In addition, the adjustment values can have the effect of injecting the additional charge within the charge storing cells 38, 40 but further away from the junctions and laterally inward towards the center of the device (i.e., "deeper" into the channel) than with the previous pulse(s). As a result, charge distribution within the charge storing cells 38, 40 can be controlled to establish a desired charge profile within the charge storing cells 38, 40.

In one embodiment, charge distribution control can be attained by appropriate selection of the adjustment values. For example, the adjustment values can be selected such that the gate voltage $V_g$ and the drain voltage $V_d$ can be increased from one pulse to the next and/or the source voltage $V_s$ can be decreased from one pulse to the next. In another embodiment, source voltage $V_s$ can be increased (along with optional changes to the gate voltage $V_g$ and the drain voltage $V_d$) so as to lower the gate to source voltage ($V_{gs}$) and/or the drain to source voltage ($V_{ds}$). In addition, any of the adjustment values can be set to zero such that a particular voltage value or a pulse width will not change form pulse to pulse.

TABLE 1

| Pulse No. | Gate Voltage ($V_g$) | Drain Voltage ($V_d$) | Source Voltage ($V_s$) | Pulse Width (millisecond) |
|---|---|---|---|---|
| 1 | $V_{go}$ | $V_{do}$ | $V_{so}$ | $PW_0$ |
| 2 | $V_{go} + \Delta V_g$ | $V_{do} + \Delta V_d$ | $V_{so} + \Delta V_s$ | $PW_0 + \Delta PW$ |
| 3 | $V_{go} + 2(\Delta V_g)$ | $V_{do} + 2(\Delta V_d)$ | $V_{so} + 2(\Delta V_s)$ | $PW_0 + 2(\Delta PW)$ |
| . | . | . | . | . |
| . | . | . | . | . |
| . | . | . | . | . |
| n | $V_{go} + (n-1)(\Delta V_g)$ | $V_{do} + (n-1)(\Delta V_d)$ | $V_{so} + (n-1)(\Delta V_s)$ | $PW_0 + (n-1)(\Delta PW)$ |

It is noted that equations 1, 2, 3 and/or 4 can each be modified depending on the desired charge injection properties desired for the charge storing cell 38, 40 being programmed. Alternatively, a data table specifying actual voltages and pulse widths can be used.

The gate voltage adjustment value ($\Delta V_g$), the source voltage adjustment value ($\Delta V_s$) and the drain voltage adjustment value ($\Delta V_d$) are selected to appropriately adjust the voltages applied to the gate electrode 34, the source and the drain during each successive program pulse applied to the memory device 6. As indicated, the adjustment values $\Delta V_g$, $\Delta V_s$ and $\Delta V_d$ can be positive or negative in value. In one embodiment, the adjustment values for each charged program level, as with the initial program voltage values $V_{go}$, It is noted that the deeper charge is stored by the charge storing cells 38, 40 into the channel, the possibility of complimentary bit disturb (CBD) issues arising during read operations increases. That is, it may be harder to keep each charge storing cell 38, 40 independent during read operations. More specifically, during a reverse read operation, the drain voltage used to create a depletion region within the body 26 may not adequately "cover up" charge stored by the complimentary bit. Therefore, control over placement of the charge into the charge storing cells 38, 40 should be maintained. The program techniques described herein offer the ability to control placement of charge such that CBD can be keep to a minimum. Such control is enhanced by the virtual ground arrangement of the memory device 6, which allows for a bias voltage to be applied to the source during program pulses.

With continued reference to FIG. 6, the first method can start in block 50 where the memory device 6 is pulsed with the initial program voltages (i.e., $V_{go}$, $V_{so}$, and $V_{do}$) for the desired program level (e.g., level B, level C or level D in the single-bit MLC and quad-bit embodiments, and the charged program level in the single-bit and dual-bit embodiments) for a specified duration. It is noted that the charge program level for the single-bit and dual-bit embodiments can be programmed using the values for program level D of the single-bit MLC and quad-bit embodiments. This pulse will be considered the first pulse (or pulse number 1) used to program the target charge storing cell 38, 40.

Thereafter, a verify operation can be carried out in block 52 to determine if sufficient charge was injected into the target charge storing cell 38, 40 to change the memory device's threshold voltage to be within the threshold voltage distribution 42, 44 associated with the desired program level. If the memory device 6 passes the verify operation of block 52, the target charge storing cell 38, 40 is considered to be programmed and the programming routine with respect to the target charge storing cell 38, 40 will end.

However, if the memory device 6 does not pass the verify operation of block 52, the method can proceed to block 54 where a pulse counter maintained by the logic circuit 12 is incremented. Next, in block 56, the memory device 6 is pulsed with the program voltages associated with the current pulse count and the desired program level. Thereafter, the method loops back to block 52 so that the foregoing routine is repeated until the charge storing cell 38, 40 is programmed as desired.

Figure 7:
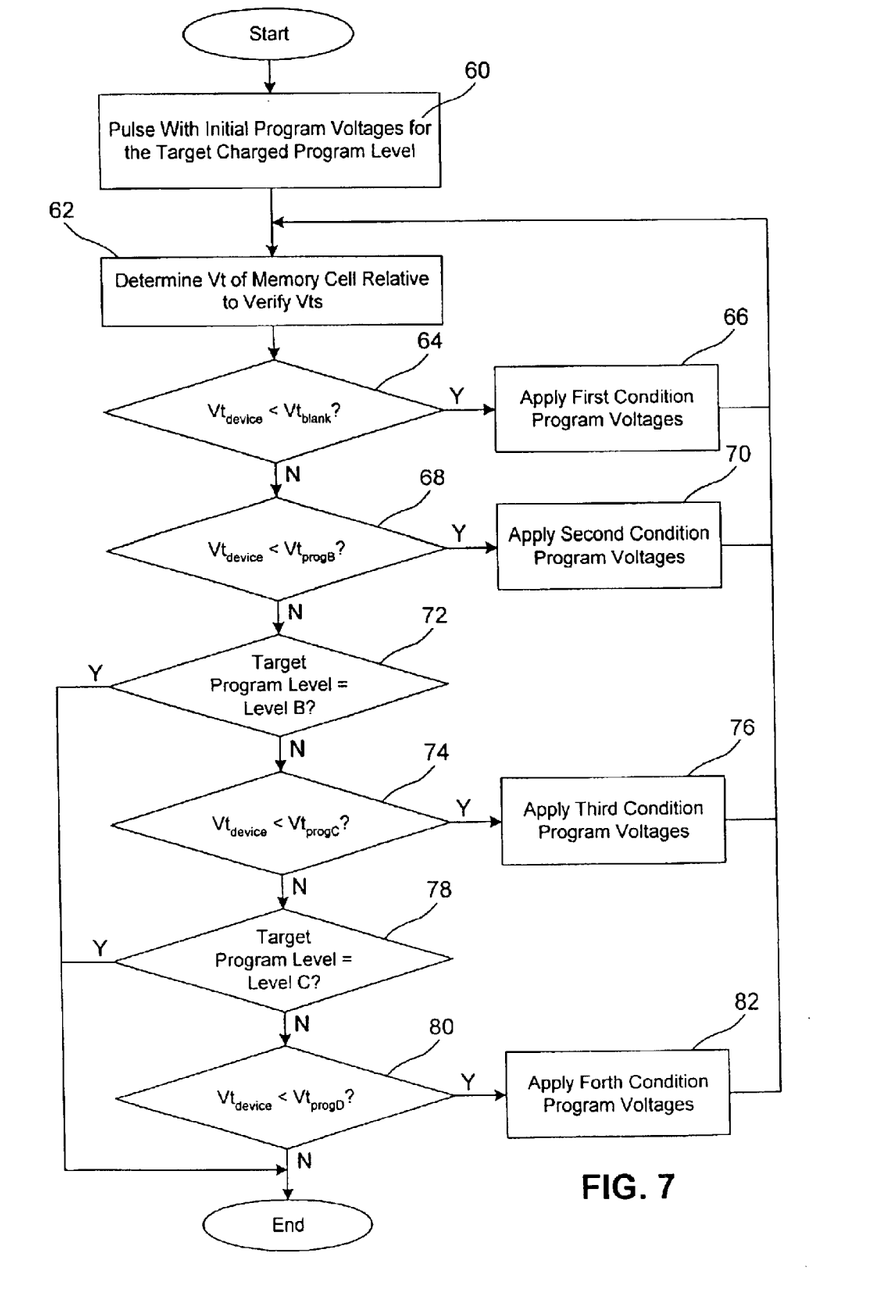
FIG. 7 is a flow diagram of a second method of programming the dual cell memory device to control program level threshold voltage distribution.

Turning now to FIG. 7, a flow diagram of a second method of programming one of the charge storing cells 38, 40 of the memory device 6 is illustrated. If desired, the method can be carried out multiple times to program the other of the charge storing cells 38, 40 or to program charge storing cells 38, 40 of other core memory devices 6.

The second method changes the program conditions (e.g. $V_g$, $V_s$ and $V_d$) based on the threshold voltage of the memory device 6 following the application of a program pulse. That is, for each program pulse, the $V_g$, $V_s$ and $V_d$ can be adjusted based on the present threshold voltage of the core memory device 6 being programmed. The number of times the memory device 6 has been pulsed during the program operation need not be counted in the second method.

As will become more apparent below, the second method involves comparing the threshold voltage of the memory cell 6 (as indicated by $I_{ds}$) against a selected number of program-verify threshold voltages (as indicated by $I_{vref}$) as discussed in greater detail above. Comparison of the threshold voltage of the memory device 6 in this manner can provide an indication of how much charge is being stored by the charge storing cell 38, 40 being programmed. From the comparisons, a determination can be made as to any adjustments to the program voltages (e.g., $V_g$, $V_s$ and $V_d$) that should be made for the next program pulse, if an additional pulse is needed.

The number of verify threshold voltages that the threshold voltage of the memory device 6 is compared against and the values of those verify threshold voltages can be selected based on factors such as the architecture of the memory device 6, the known behavior of the memory device 6, the programming embodiment (e.g., single-bit, dual-bit, single-bit MLC, quad-bit, etc.), the program level to which the charge storing cell 38, 40 is being programmed, and so forth.

For example, if the target charge storing cell 38, 40 is programmed to level B, the program-verify threshold voltages can include program-verify threshold corresponding to two values, such as the erase threshold voltage (FIG. 5, $Vt_{blank}$) and the minimum threshold voltage of level B (FIG. 5, $Vt_{progB}$). Similarly, if the target charge storing cell 38, 40 is programmed to level C, the program-verify threshold voltages can include program-verify threshold corresponding to three values, such as the erase threshold voltage (FIG. 5, $Vt_{blank}$), the minimum threshold voltage of level B (FIG. 5, $Vt_{progB}$) and the minimum threshold voltage of level C (FIG. 5, $Vt_{progC}$). Similarly, if the target charge storing cell 38, 40 is programmed to level D (single-bit MLC and quad-bit embodiments) or the charged program level (single-bit or dual-bit embodiments), the program-verify threshold voltages can include program-verify threshold corresponding to three values, such as the erase threshold voltage (FIG. 5, $Vt_{blank}$), the minimum threshold voltage of level B (FIG. 5, $Vt_{progB}$), the minimum threshold voltage of level C (FIG. 5, $Vt_{progC}$) and the minimum threshold voltage of level D (FIG. 5, $Vt_{progD}$). It is noted that the program-verify threshold voltages for the second method need not correspond to defined points of the program level distributions 42, 44.

Generally, the second method can start in block 60 where the memory device 6 is pulsed with initial program voltages for the desired program level for a specified duration. The initial program voltages can be, for example, the same as the initial program voltages used in the first method (e.g., $V_{go}$, $V_{so}$ and $V_{do}$).

Thereafter, the threshold voltage of the memory device 6 ($Vt_{device}$) can be determined in block 62. In one embodiment, $Vt_{device}$ is indicated by $I_{ds}$. It is noted that an actual threshold voltage value of the memory device 6 may not be determined, but rather the threshold voltage of the memory device 6 can be compared against the program-verify threshold values appropriate for the desired program level to determine the relative threshold voltage of the memory device 6. In one embodiment, the program-verify threshold values are indicated by corresponding currents ($I_{vref}$) that are compared against $I_{ds}$ using, for example, sense amplifiers.

As illustrated in the subsequent blocks of FIG. 7, $Vt_{device}$ is compared against the various program-verify threshold voltages. Although illustrated as a sequentially process, the comparisons can be made simultaneously to determine the relative threshold voltage of the memory device 6 with expediency. The logic circuit 12 can include logic gates to assist in this determination.

If in block 64, the threshold voltage of the memory device is less than a first program-verify threshold voltage (e.g., $Vt_{blank}$), then the memory device 6 can be pulsed again in block 66 with a set of program voltages, referred to as first condition program voltages. Thereafter, the method can loop back to block 62.

The first condition program voltages, as well as subsequent condition program voltages discussed below, can be selected based on various factors such as the program level to which the charge storing cell 38, 40 is being programmed, the architecture of the memory device 6, the known behavior of the memory device 6, etc. Table 2 illustrates exemplary condition program values. However, one skilled in the art will appreciate that alternative tables can be derived.

TABLE 2

|  | First Condition Program Voltages | Second Condition Program Voltages | Third Condition Program Voltages | Fourth Condition Program Voltages |
|---|---|---|---|---|
| Gate Voltage ($V_g$) | $V_{g\_max}$ | $V_{g\_2}$ | $V_{g\_3}$ | $V_{g\_4}$ |
| Drain Voltage ($V_d$) | $V_{d\_max}$ | $V_{d\_2}$ | $V_{d\_3}$ | $V_{d\_4}$ |
| Source Voltage ($V_s$) | $V_{s\_min}$ | $V_{s\_2}$ | $V_{s\_3}$ | $V_{s\_4}$ |

In the second method, changes to the program pulse voltages based on the threshold voltage of the memory device 6 are made to incrementally increase the threshold voltage of the memory device 6, if needed. Adjustments can be made based on how much more additional charge may be needed to achieve the desired threshold voltage of the memory device 6 and to avoid over-charging the charge storing cells 38, 40. In this manner tight control over the threshold voltage distributions 42, 44 for each program level and the location of charge within the charge storing cells 38, 40 can be accomplished. Optionally, program voltages are selected to move charge laterally deeper into the channel as threshold voltage of the memory device 6 increases (similar to the charge placement technique described above with respect to the first method).

In the example presented in table 2, the first condition program voltages include applying a "maximum" gate voltage (e.g., $V_{g\_}^{max}$), a "maximum" drain voltage (e.g., $V_{d\_}^{max}$) and a "minimum" voltage (e.g., $V_{s\_}^{min}$). In this example, the terms maximum and minimum are used to refer to starting point voltage potentials from which the gate and drain potentials may be reduced and the source voltage may be increased. The maximum gate and drain voltages are used to inject a additional amount of charge into the target charge storing cell 38, 40 so as to relatively rapidly increase the threshold voltage of the memory device 6. In one embodiment, the gate and drain voltages for the second, third and fourth program conditions (e.g., $V_{g\_}^2$, $V_{g\_}^3$ and $V_{g\_}^4$, and $V_{d\_}^2$, $V_{d\_}^3$, and $V_{d\_}^4$) represent progressively decreasing gate and drain voltages from the voltage values of the first condition such that incremental amounts of charge are injected into the charge storing cell 38, 40. In one embodiment, the potentials corresponding to the first, second, third and fourth program conditions can be selected to minimize the occurrence of overcharging the charge storing cell 38, 40 (e.g., exceeding the maximum threshold voltage for the associated charge distribution 42, 44). If desired, the source voltage can be progressively increased from the first program condition to the higher order program conditions.

It is noted that the program conditions can be different for each charged program level. For instance, the condition program voltages can be selected such that $V_{gs}$ and $V_{ds}$ are higher when programming to level D than when programming to level B.

In an alternative embodiment, the gate voltage and/or drain voltage can be increased or kept constant from program condition to program condition and/or the source voltage can be decreased or kept constant from program condition to program condition.

In addition to modifying the program pulse voltages, the pulse width can be altered depending on relative threshold voltage of the core memory device 6.

Continuing with the flow diagram of FIG. 7, if in block 64 the threshold voltage of the memory device 6 is greater than a first verify threshold voltage ($Vt_{blank}$) but is less than a second verify threshold voltage ($Vt_{progB}$) in block 68, then the memory cell can be pulsed with the second condition program voltages in block 70. Thereafter, the method can loop back to block 62. Referring to table 2, exemplary values for the program pulse of block 70 are presented under the column heading "Second Condition Program Voltages."

If, in block 68, the threshold voltage of the memory device 6 is greater than the second verify threshold voltage ($Vt_{progB}$) the method can proceed to block 72. If in block 72, the desired program level is level B, then the target charge storing cell 38, 40 can be considered sufficiently programmed and the method can end with respect to the target charge storing cell 38, 40. Otherwise the method can proceed in block 74.

If, block 74, the threshold voltage of the memory device 6 is less than a third verify threshold voltage ($Vt_{progC}$), then the memory cell can be pulsed with the third condition program voltages in block 76. Thereafter, the method can loop back to block 62. Referring to table 2, exemplary values for the program pulse of block 76 are presented under the column heading "Third Condition Program Voltages."

If, in block 64, the threshold voltage of the memory device 6 is greater than the third verify threshold voltage ($Vt_{progC}$) the method can proceed to block 78. If in block 78, the desired program level is level C, then the target charge storing cell 38, 40 can be considered sufficiently programmed and the method can end with respect to the target charge storing cell 38, 40. Otherwise the method can proceed in block 80.

If, block 80, the threshold voltage of the memory device 6 is less than a fourth verify threshold voltage ($Vt_{progD}$), then the memory cell can be pulsed with the fourth condition program voltages in block 82. Thereafter, the method can loop back to block 62. Referring to table 2, exemplary values for the program pulse of block 82 are presented under the column heading "Fourth Condition Program Voltages."

If, in block 80, the threshold voltage of the memory device 6 is greater than the fourth verify threshold voltage ($Vt_{progD}$) the target charge storing cell 38, 40 can be considered sufficiently programmed (e.g., programmed to level D in the single-bit MLC and quad-bit embodiments or the charged program level in the single-bit and dual-bit embodiments) and the method can end with respect to the target charge storing cell 38, 40.

Programming the memory device 6 in accordance with the techniques described herein (e.g., the first or second methods) can contribute to control over the program level distributions 42, 44. More specifically, the minimum and maximum threshold voltages for each program level distribution can be brought closer together than is found with prior art techniques. As a result, CBD can be kept to a minimum, particularly when the unread charge storing cell 38, 40 is programmed to a high order program level (e.g., level C or level D).

Programming the memory device 6 in accordance with the techniques described herein can also contribute to increasing the program operation speed. Program operation speed can be increased due to controlled application of electric fields to achieve the desired amount of charge injection. Read operation speed and accuracy can be increased since the programming techniques lead to a greater separation in the threshold voltage distributions with reduced CBD, making it easier for the logic circuit 12 to accurately identify the appropriate program level.

Although particular embodiments of the invention have been described in detail, it is understood that the invention is not limited correspondingly in scope, but includes all changes, modifications and equivalents coming within the spirit and terms of the claims appended hereto.

For example, each of the charge storing cells 38, 40 can be programmed with greater resolution (e.g., additional program levels) such that each charge storing cell 38, 40 can store three or more bits of data.

What is claimed is:

1. A method of programming a charge trapping dielectric memory device having a first charge storing cell and a second charge storing cell, comprising:

a) applying an initial program pulse including initial gate, drain and source program voltages to the memory device to inject an amount of charge into a selected one of the first or second charge storing cells, the amount of change corresponding to a charged program level;

b) comparing a threshold voltage of the memory device with a verify threshold voltage; and c) if the threshold voltage of the memory device is less than the verify threshold voltage, applying a second program pulse to the memory device during which at least one of the initial gate, drain and source program voltages is modified from the corresponding initial program voltage;

wherein the charged program level is selected from a plurality of charged program levels.

2. The method according to claim 1, wherein the initial gate, drain and source program voltages are selected for the selected charged program level from the plurality of charged program levels.

3. The method according to claim 1, wherein the at least one modified program voltage is selected for the selected charged program level from the plurality of charged program levels.

4. A method of programming a charge trapping dielectric memory device having a first charge storing cell and a second charge storing cell, comprising:

a) applying an initial program pulse including initial gate, drain and source program voltages to the memory device to inject an amount of charge into a selected one of the first or second charge storing cells, the amount of charge corresponding to a charged program level;

b) comparing a threshold voltage of the memory device with a verify threshold voltage;

c) if the threshold voltage of the memory device is less than the verify threshold voltage applying a second program pulse to the memory device during which at least one of the initial gate, drain and source program voltages is modified from the corresponding initial program voltage find wherein b) and c) are repeated until the threshold voltage of the memory device is at least equal to the verify threshold voltage;

d) counting the number of times the memory cell is pulsed and wherein modification to the initial program voltages is made based on the number of pulses.

5. The method according to claim 4, wherein in c) each of the initial gate, drain and source program voltages are modified.

6. The method according to claim 4, wherein the charged program level is selected from a plurality of charged program levels and modification to the initial program voltages is further based on the selected charged program level from the plurality of charged program levels.

7. The method according to claim 4, wherein modification to the gate voltage is made according to the formula:

$$V_{go} + (\text{Pulse No.} - 1) \times \Delta V_g$$

wherein $V_{go}$ is the initial gate voltage, pulse no is the current number of the pulse to be applied to the memory device and $\Delta V_g$ is a gate voltage adjustment value.

8. The method according to claim 4, wherein modification to the source voltage is made according to the formula:

$$V_{so} + (\text{Pulse No.} - 1) \times \Delta V_s$$

wherein $V_{so}$ is the initial source voltage, pulse no is the current number of the pulse to be applied to the memory device and $\Delta V_s$ is a source voltage adjustment value.

9. The method according to claim 4, wherein modification to the drain voltage is made according to the formula:

$$V_{do} + (\text{Pulse No.} - 1) \times \Delta V_d$$

wherein $V_{do}$ is the initial drain voltage, pulse no is the current number of the pulse to be applied to the memory device and $\Delta V_d$ is a drain voltage adjustment value.

10. The method according to claim 4, wherein each charge storing cell is configured to store charge corresponding to a first data state associated with a blank program level or a second data state associated with a charged program level.

11. The method according to claim 10, wherein the charge storing cells are programmed to the same data state.

12. The method according to claim 4, wherein each charge storing cell is configured to store charge corresponding to a first data state associated with a blank program level, a second data state associated with a first charged program level, a third data state associated with a second charged program level, or a fourth data state associated with a third charged program level.

13. The method according to claim 12, wherein the charge storing cells are programmed to the same data state.

14. The method according to claim 4, wherein if the threshold voltage of the memory device is less than the verify threshold voltage, the second program pulse is applied with a pulse width that is modified from a pulse width of the initial program pulse.

15. The method according to claim 4, wherein the charged program level is selected from a plurality of charged program levels.

16. The method according to claim 15, wherein the initial gate, drain and source program voltages are selected for the selected charged program level from the plurality of charged program levels.

17. The method according to claim 4, wherein the gate and drain voltages for the second program pulse are lowered relative to the initial program pulse.

18. The method according to claim 4, wherein the source voltage for the second program pulse is raise relative to the initial program pulse.

19. A method of programming a charge trapping dielectric memory device having a first charge storing cell and a second charge storing cell, comprising:

a) applying an initial program pulse including initial gate, drain and source program voltages to the memory device to inject an amount of charge into a selected one of the first or second charge storing cells, the amount of charge corresponding to a charged program level;

b) comparing a threshold voltage of the memory device with a verify threshold voltage; and c) if the threshold voltage of the memory device is less then the verify threshold voltage, applying a second program pulse to the memory device during which at least one of the initial gate, drain and source program voltage is modified from the corresponding initial program voltage;

wherein b) is carried out for a plurality verify threshold voltages and modification to the initial program voltages in c) is based on the relative value of the threshold voltage of the memory device to the verify threshold voltages.

20. The method according to claim 19, wherein the charged program level is selected from a plurality of charged program levels and modification to the initial program voltages is further based on the selected charged program level from the plurality of charged program levels.

21. The method according to claim 19, wherein b) and c) are repeated until the threshold voltage of the memory device is at least equal to the highest of the verify threshold voltages.

22. The method according to claim 19, wherein the charged program level is selected from a plurality of charged program levels.

23. The method according to claim 19, wherein if the threshold voltage of the memory device is less than the verily threshold voltage, the second program pulse is applied with a pulse width that is modified from a pulse width of the initial program pulse.

24. The method according to claim 19, wherein the gate and drain voltages for the second program pulse are lowered relative to the initial program pulse.

25. The method according to claim 19, wherein the source voltage for the second program pulse is raise relative to the initial program pulse.

26. A method of programming a charge trapping dielectric memory device having a first charge storing cell and a second charge storing cell, comprising:

a) applying an initial program pulse including initial gate, drain and source program voltages to the memory device to inject an amount of charge into a selected one of the first or second charge storing cells, the amount of charge corresponding to a charged program level;

b) comparing a threshold voltage of the memory device with a verify threshold voltage; and c) if the threshold voltage of the memory device is less than the verify threshold voltage, applying a second program pulse to the memory device during which at least one of the initial gate, drain and source program voltages is modified from the corresponding initial program voltage;

wherein the gate and drain voltages for the second program pulse are lowered relative to the initial program pulse.

27. The method according to claim 26, wherein the source voltage for the second program pulse is raise relative to the initial program pulse.

28. The method according to claim 26, wherein the charged program level is selected from a plurality of charged program levels.

29. The method according to claim 28, wherein the initial gate, drain and source program voltages are selected for the selected charged program level from the plurality of charged program levels.

30. The method according to claim 28, wherein the at least one modified program voltage is selected for the selected charged program level from the plurality of charged program levels.

31. The method according to claim 26, wherein if the threshold voltage of the memory device is less than the verify threshold voltage, the second program pulse is applied with a pulse width that is modified from a pulse width of the initial program pulse.

32. A method of programming a charge trapping dielectric memory device having a first charge storing cell and a second charge storing cell, comprising:

a) applying an initial program pulse including initial gate, drain and source program voltages to the memory device to inject an amount of charge into a selected one of the first or second charge storing cells, the amount of charge corresponding to a charged program level;

comparing a threshold voltage of the memory device with a verify threshold voltage; and c) if the threshold voltage of the memory device is less than the verify threshold voltage, applying a second program pulse to the memory device during which at least one of the initial gate, drain and source program voltages is modified from the corresponding initial program voltage;

wherein the source voltage for the second program pulse is raise relative to the initial program pulse.

33. The method according to claim 32, wherein the charged program level is selected from a plurality of charged program levels.

34. The method according to claim 33, wherein the initial gate, drain and source program voltages are selected for the selected charged program level from the plurality of charged program levels.

35. The method according to claim 33, wherein the at least one modified program voltage is selected for the selected charged program level from the plurality of charged program levels.

36. The method according to claim 32, wherein if the threshold voltage of the memory device is less than the verify threshold voltage, the second program pulse is applied with a pulse width that is modified from a pulse width of the initial program pulse.

* * * * *

UNITED STATES PATENT AND TRADEMARK OFFICE
CERTIFICATE OF CORRECTION

PATENT NO.    : 6,822,909 B1
DATED         : November 23, 2004
INVENTOR(S)   : Hamilton et al.

It is certified that error appears in the above-identified patent and that said Letters Patent is hereby corrected as shown below:

Column 15,
Line 30, replace "$V_g\_^{max}$" with -- $V_{g\_max}$ --.
Line 31, replace "$V_d\_^{max}$" with -- $V_{d\_max}$ --.
Line 31, replace "$V_s\_^{min}$" with -- $V_{s\_min}$ --.
Line 40, replace "$V_g\_^2$" with -- $V_{g\_2}$ --.
Line 40, replace "$V_g\_^3$" with -- $V_{g\_3}$ --.
Line 41, replace "$V_g\_^4$" with -- $V_{g\_4}$ --.
Line 41, replace " $V_d\_^2$" with -- $V_{d\_2}$ --.
Line 41, replace "$V_d\_^3$" with -- $V_{d\_3}$ --.
Line 41, replace "$V_d\_^4$" with -- $V_{d\_4}$ --.

Column 17,
Line 8, replace "change" with -- charge --.
Line 50, replace "find" with -- and --.
Line 51, insert -- and -- after "voltage;"

Column 18,
Line 67, replace "then" with -- than --.

Column 19,
Line 4, replace "voltage" with -- voltages --.
Line 24, replace "verily" with -- verify --.

Column 20,
Line 26, insert -- b) -- before "comparing".

Signed and Sealed this

Twenty-ninth Day of March, 2005

JON W. DUDAS
*Director of the United States Patent and Trademark Office*